United States Patent [19]

Kubota et al.

[11] Patent Number: 5,300,348

[45] Date of Patent: Apr. 5, 1994

[54] FRAME-SUPPORTED PELLICLE FOR PHOTOLITHOGRAPHY, COMPRISING A FLUOROCARBON CONTAINING ORGANOPOLYSILOXANE BASED ADHESIVE

[75] Inventors: Yoshihiro Kubota; Meguru Kashida; Yoshihiko Nagata; Hitoshi Noguchi; Yuichi Hamada; Shinichi Sato; Hiroshi Inomata, all of Gunma, Japan

[73] Assignee: Shin-Etsu Chemical Co., Ltd., Tokyo, Japan

[21] Appl. No.: 959,032

[22] Filed: Oct. 8, 1992

[30] Foreign Application Priority Data

Oct. 15, 1991 [JP] Japan .................................. 3-295124

[51] Int. Cl.$^5$ ............................................. B32B 9/60
[52] U.S. Cl. ...................................... 428/194; 430/5; 428/447; 428/421
[58] Field of Search ........................... 528/15, 31, 32; 428/447, 422, 194, 355, 506, 206, 524, 421; 430/5

[56] References Cited

U.S. PATENT DOCUMENTS 5,073,422  12/1991  Konno et al. ........................ 528/31
5,168,001  12/1992  Legare et al. ...................... 428/422

*Primary Examiner*—Patrick J. Ryan
*Assistant Examiner*—Patrick R. Jewik
*Attorney, Agent, or Firm*—McAulay Fisher Nissen Goldberg & Kiel

[57] ABSTRACT

An improvement is proposed in a frame-supported pellicle consisting of a frame member and a thin transparent polymer membrane adhesively bonded to the frame member used for dustproof covering of a photomask in a photolithograpic patterning work of electronic devices. The improvement comprises using a specific fluorocarbon group-containing organosiloxane-based polymeric composition as an adhesive for adhesively bonding the frame member and the polymer membrane. This adhesive is effective even when the polymeric membrane is formed from a fluorocarbon polymer which is hardly susceptible to adhesive bonding with conventional adhesives. In addition, the adhesive bonding by use of this specific adhesive is highly durable even under irradiation with ultraviolet light.

3 Claims, No Drawings

FRAME-SUPPORTED PELLICLE FOR PHOTOLITHOGRAPHY, COMPRISING A FLUOROCARBON CONTAINING ORGANOPOLYSILOXANE BASED ADHESIVE

BACKGROUND OF THE INVENTION

The present invention relates to an improvement in a frame-supported pellicle for photolithography or, more particularly to an improvement in a pellicle for photolithography consisting of a thin transparent membrane of a polymeric material flatly supported on a frame member by adhesively bonding thereto using an adhesive.

As is known, various kinds of electronic devices such as LSIs, VLSIs, liquid-crystal display units and the like are manufactured by a process involving a photolithographic patterning work on a substrate such as a semiconductor silicon wafer. The photolithographic patterning is conducted by using a photomask bearing a pattern, through which the substrate surface is exposed patternwise to ultraviolet light. Along with the trend in recent years toward more and more increased fineness of patterns in the photolithography, it is very important that the photomask used therefor is absolutely free from dust particles deposited thereon in order to ensure accuracy and fidelity of the photolithographically reproduced pattern. In view of the fact that perfect absence of dust particles on a photomask can hardly be achieved even by working in a clean room of the highest cleanness, it is a usual practice to protect the photomask from dust particle deposition by mounting a frame-supported pellicle thereon.

A frame-supported pellicle for photolithography used in the above described purpose consists of a frame member made, usually, from aluminum, stainless steel, polyethylene and the like and a thin membrane of a polymeric material such as nitrocellulose, cellulose acetate and the like having transparency to the light used in the patterning exposure, which is flatly supported on the frame by adhesively bonding with an adhesive. Since the pellicle membrane is held above the photomask at a certain distance and the exposure light is focused on to the pattern on the photomask, the dust particles, even when they are deposited on the pellicle membrane, cause no particular drawbacks relative to the quality of the photolithographically reproduced pattern.

Various kinds of adhesives are used for adhesively bonding a pellicle membrane to the frame member including those disclosed in U.S. Pat. No. 4,861,402 and Japanese Patent Publication No. 63-27707 such as epoxy resin-based and acrylic resin-based adhesives. Alternatively, as is taught in Japanese Patent Kokai No. 58-219023, a pellicle membrane can be adhesively boned to the frame member by wetting the surface of the frame member with an organic solvent having good dissolving power for the polymeric material of the membrane and mounting the membrane directly on the thus wetted frame.

A problem in the above described frame-supported pellicle is that, in addition to the requirement for a high adhesive bonding strength between the membrane and the frame member as a matter of course, the adhesive bonding is sometimes not quite reliable in the lapse of time after prolonged use of the pellicle since the adhesive layer is under direct exposure to the ultraviolet light which is detrimental against the polymeric material of the adhesive to cause degradation of the adhesive resin. For example, conventional adhesives based on an epoxy resin or an acrylic resin are not quite satisfactory in this regard and, if not to mention the relatively poor adhesive bonding strength therewith, these adhesives are subject to remarkable photodegradation under irradiation with ultraviolet light so as to become brittle resulting in occurrence of dust particles from the embrittled adhesive resin or peeling of the membrane from the frame. In addition, the above mentioned conventional adhesives based on an epoxy or acrylic resin cannot be used for adhesively bonding a frame member and a pellicle membrane when the membrane is formed from a fluorocarbon group-containing polymer recently proposed as a material of pellicle membranes by virtue of the very excellent performance thereof as compared with conventional cellulose derivatives because such a fluorine-containing polymer is poorly susceptible to adhesive bonding.

SUMMARY OF THE INVENTION

The present invention accordingly has an object to provide an improved frame-suppored pellicle for dust-proof protection of a photomask used in the photolithographic patterning work in the manufacture of various kinds of electronic devices, by which the above described problems and disadvantages can mostly be dissolved even when the pellicle membrane is formed from a fluorocarbon group-containing polymer.

Thus, the present invention provides an improvement which comprises, in a frame-supported pellicle used for protection of a photolithographic photomask in the manufacture of electronic devices consisting of a frame member and a thin transparent membrane of a polymeric material flatly supported by the frame member by adhesively bonding the frame member and the polymeric membrane using an adhesive which is a fluorocarbon group-containing organopolysiloxane composition or, in particular, an organopolysiloxane-based composition comprising, as a uniform blend:

(A) a fluorocarbon group-containing organosiloxane polymer represented by the general formula

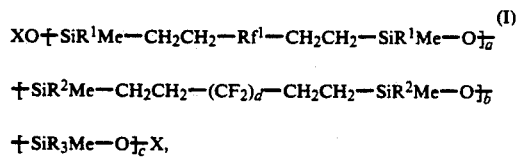

$$XO + SiR^1Me - CH_2CH_2 - Rf^1 - CH_2CH_2 - SiR^1Me - O_{\overline{a}}^{\phantom{a}} \quad \text{(I)}$$

$$+ SiR^2Me - CH_2CH_2 - (CF_2)_d - CH_2CH_2 - SiR^2Me - O_{\overline{b}}^{\phantom{b}}$$

$$+ SiR_3Me - O_{\overline{c}}^{\phantom{c}} X,$$

in which Me is a methyl group, $R^1$, $R^2$ and $R^3$ are each an unsubstituted or substituted monovalent hydrocarbon group free from aliphatic unsaturation, $Rf^1$ is a divalent group having 1 to 30 carbon atoms selected from the class consisting of perfluoroalkylene groups and perfluoropolyether groups, X is a triorganosilyl group of which at least one of the three organic groups is an aliphatically unsaturated hydrocarbon group, the subscript a is a positive integer in the range from 1 to 300, the subscript b is zero or a positive integer not exceeding 300, the subscript c is zero or a positive integer not exceeding 5000 and the subscript d is a positive integer in the range from 2 to 8;

(B) either one or a combination of (B1) an organohydrogenpolysiloxane having at least two hydrogen atoms directly bonded to the silicon atoms in a molecule, of which the organic groups are each an alkyl group or a halogen-substituted alkyl group, the amount thereof being sufficient to provide from 0.5 to 5 moles of the silicon-bonded hydrogen atoms per mole of the aliphatically unsaturated groups in the component (A) and (B2) an organohydrogenpolysiloxane having at least two hydrogen atoms directly bonded to the silicon atoms in a molecule and containing a fluorine-substituted hydrocarbon group and an epoxy group, the amount thereof being sufficient to provide from 0.1 to 3 moles of the silicon-bonded hydrogen atoms per mole of the aliphatically unsaturated groups in the component (A); and (C) a catalytic amount of a compound of a noble metal belonging to the VIIIth Group of the Periodic Table or, in particular, platinum.

DETAILED DESCRIPTION OF THE PREFERRED EMBODIMENTS

As is described above, the most characterisic feature of the inventive improvement consists in the use of a specific adhesive composition for bonding the frame member and the polymeric membrane to prepare a frame-supported pellicle, which adhesive is an organopolysiloxane-based composition comprising the above defined essential ingredients of (A) to (C).

The component (A) is a fluorocarbon group-containing organopolysiloxane represented by the general formula

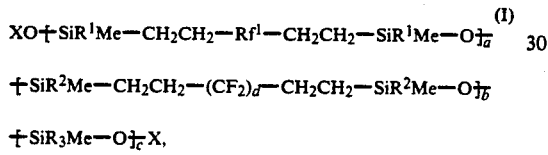

in which Me is a methyl group, $R^1$, $R^2$ and $R^3$ are each an unsubstituted or substituted monovalent hydrocarbon group free from aliphatic unsaturation, such as methyl, phenyl and 3,3,3-trifluoropropyl groups, $Rf^1$ is a divalent group having 1 to 30 carbon atoms selected from the class consisting of perfluoroalkylene groups and perfluoropolyether groups, X is a triorganosilyl group of which at least one of the three organic groups is an aliphatically unsaturated hydrocarbon group, the subscript a is a positive integer in the range from 1 to 300, the subscript b is zero or a positive integer not exceeding 300, the subscript c is zero or a positive integer not exceeding 5000 and the subscript d is a positive integer in the range from 2 to 8.

The perfluoroalkylene group or perfluoropolyether group denoted by $Rf^1$ is represented by the general formula

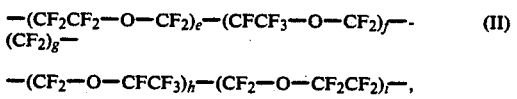

in which the subscripts f and h are each zero or a positive integer not exceeding 5, the subscript g is zero or a positive integer not exceeding 8 and the subscripts e and i are each zero or 1. Further, the group denoted by X is a triorganosilyl group represented by the general formula $$-SiR^4R^5R^6, \quad (III)$$

in which $R^4$ is a aliphatically unsaturated monovalent hydrocarbon group and $R^5$ and $R^6$ are each a monovalent hydrocarbon group which may be saturated or unsaturated.

An example of the component (A) is a random or alternating organosiloxane copolymer expressed by the structural formula

$+SiMe_2-CH_2CH_2-Rf^1-CH_2CH_2-SiMe_2-O]_{\overline{q}}SiMe_2-Vi,$ in which Me is a methyl group, Vi is a vinyl group, $Rf^1$ has the same meaning as defined above and the subscripts p and q are each a positive integer.

The component (B1) is an organohydrogenpolysiloxane which is a well known material in the art of silicone technology which serves as a crosslinking agent of the component (A). In addition, silalkylene group-containing organohydogenpolysiloxane can also be used, examples of which include those expressed by the following formulas:

$(HSiMe_2-O-)_2SiMe-CH_2CH_2CF_2CF_2CH_2CH_2-$ $-SiMe(-O-SiMe_2H)_2;$ and $HSiMe_2-O-SiMe(CH_2CH_2CF_3)-CH_2CH_2-$ $-CF_2CF_2CH2CH_2-SiMe(CH_2CH_2CF_3)-O-SiMe_2H.$ The component (B2) is a specific organohydrogenpolysiloxane having, in a molecule, at least one perfluoroalkylene or perfluoropolyether group having 3 to 20 carbon atoms and at least one epoxy group. An example of such a specific organohydrogenpolysiloxane, which services also as a crosslinking agent of the component (A), is expressed by the following formula:

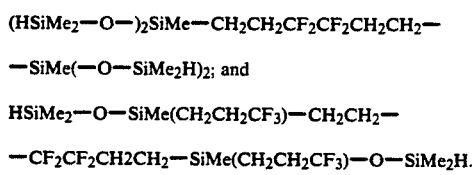

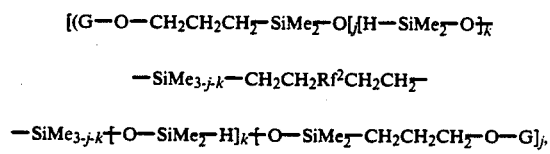

in which G is a glycidyl group, the subscripts j and k are each a positive integer with the proviso that j+k does not exceed 3 and $Rf^2$ is a divalent perfluoroalkylene or perfluoropolyether group having 3 to 20 carbon atoms by similar to $Rf^1$.

Following is a further detailed description of each of the essential components (A) to (C) in the adhesive composition.

In the general formula (I) representing the component (A), $R^1$, $R^2$ and $R^3$ are each a monovalent hydrocarbon group or halogen-substituted monovalent hydrocarbon group free from aliphatic unsaturation exemplified by alkyl groups such as methyl, ethyl, propyl and butyl groups, cycloalkyl groups such as cyclohexyl group and aryl groups such as phenyl and tolyl groups as well as halogen-substituted alkyl groups such as chloromethyl and 3,3,3-trifluoropropyl groups.

The divalent group $Rf^1$ in the general formula (I) is a perfluoroalkylene or perfluoropolyether group having 1 to 30 carbon atoms represented by the general formula

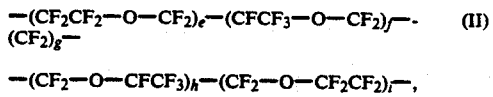

in which the subscripts f and h are each zero or a positive integer not exceeding 5, the subscript g is zero or a positive integer not exceeding 8 and the subscripts e and I are each zero or 1. Examples of the group denoted by $Rf^1$ include those expressed by the following formulas:

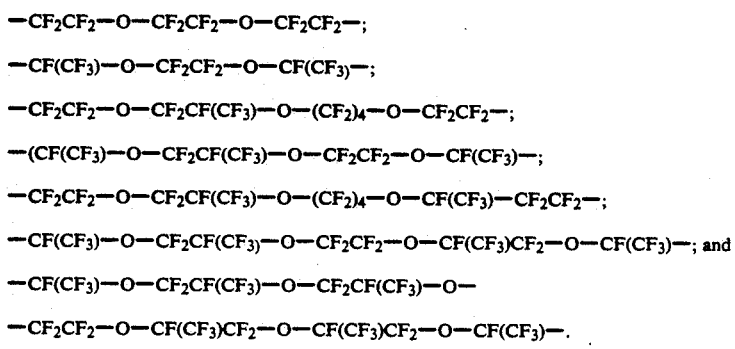

The group denoted by X in the general formula (I) is a triorganosilyl group represented by the general formula (III), in which $R^4$ is an aliphatically unsaturated monovalent hydrocarbon group such as vinyl, allyl and isopropenyl groups while $R^5$ and $R^6$ are each a monovalent hydrocarbon group having 1 to 8 carbon atoms exemplified by alkyl groups such as methyl, ethyl, propyl and butyl groups, cycloalkyl groups such as cyclohexyl group, alkenyl groups such as vinyl, allyl and isopropenyl groups and aryl groups such as phenyl and tolyl groups as well as halogen-substituted alkyl groups such as chlormethyl, 3-chloropropyl, 3,3,3-trifluoropropyl and 6,6,5,5,4,4,3,3-nonafluorohexyl groups.

Examples of the fluorocarbon-containing organopolysiloxane as the component (A) include those expressed by the following structural formulas, in which Me is a methyl group, Vi is a vinyl group and $Rf^1$ has the same meaning as defined before:

Vi—SiMe$_2$—O—[—SiMe$_2$—CH$_2$CH$_2$—Rf$^1$—CH$_2$CH$_2$—SiMe$_2$—O—]$_u$—SiMe$_2$—Vi, in which the subscript u is an average number of about 2.5;

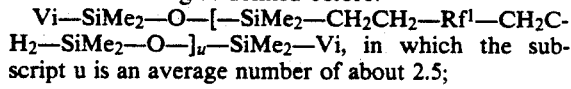

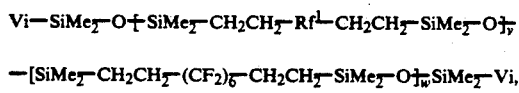

in which the subscripts v and w are each a positive integer of about 25 and 3, respectively; and

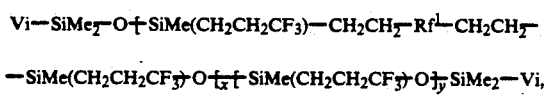

in which the subscripts x and y are each a positive integer of about 30 and about 5, respectively.

The organohydrogenpolysiloxane as the component (B1) can be a conventional one having a molecular structure which may be straightly linear, branched or cyclic irrespective of the molecular weight. It is preferable, however, that the organohydrogenpolysiloxane has a molecular weight not exceeding 20,000 in view of the relatively simple procedure for the preparation thereof. Examples of the organohydrogenpolyasiloxane as the component (B1) include those expressed by the following formulas, in which Me is a methyl group, Ph is a phenyl group, $Rf^2$ has the meaning as defined before and the subscripts m and n are each a positive integer:

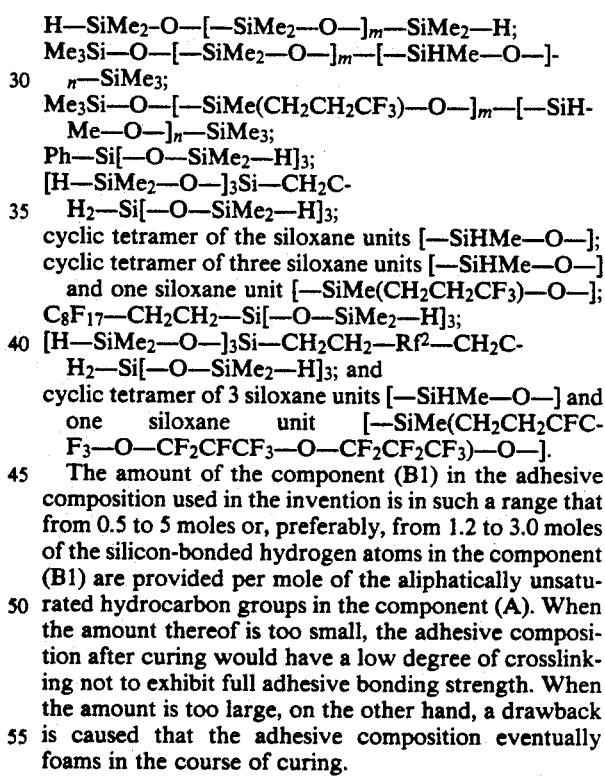

The amount of the component (B1) in the adhesive composition used in the invention is in such a range that from 0.5 to 5 moles or, preferably, from 1.2 to 3.0 moles of the silicon-bonded hydrogen atoms in the component (B1) are provided per mole of the aliphatically unsaturated hydrocarbon groups in the component (A). When the amount thereof is too small, the adhesive composition after curing would have a low degree of crosslinking not to exhibit full adhesive bonding strength. When the amount is too large, on the other hand, a drawback is caused that the adhesive composition eventually foams in the course of curing.

The component (B2), which is used in place of or in combination with the component (B1), is an organohydrogenpolysiloxane having, simultaneously, at least one fluorocarbon group and an epoxy group in a molecule and serves also as a crosslinking agent in the adhesive composition. Examples thereof include those expressed by the following formulas, in which Me is a methyl group, G is a glycidyl group and $Rf^2$ has the same meaning as defined before:

—Si[—O—SiMe$_2$—H]$_2$—[—O—SiMe$_2$—CH$_2$CH$_2$—O—G];

[G—O—CH$_2$CH$_2$CH$_2$—SiMe$_2$—O—][H—SiMe$_2$—O—]$_2$Si—CH$_2$CH$_2$—Rf$^2$—CH$_2$CH$_2$—

—Si[—O—SiMe$_2$—H]$_2$[—O—SiMe$_2$—CH$_2$CH$_2$CH$_2$—O—G];

and

[H—SiMe$_2$—O—]$_3$Si—CH$_2$CH$_2$—(CF$_2$)$_6$—CH$_2$CH$_2$—

—Si[—O—SiMe$_2$—H]$_2$[—O—SiMe$_2$—CH$_2$CH$_2$CH$_2$—O—G].

The amount of the component (B2) in the adhesive composition used in the invention is in such a range that from 0.1 to 3 moles or, preferably, from 0.3 to 2.0 moles of the silicon-bonded hydrogen atoms in the component (B2) are provided per mole of the aliphatically unsaturated hydrocarbon groups in the component (A). When the amount thereof is too small, the adhesive composition after curing would have a low adhesive bonding strength. When the amount is too large, on the other hand, a drawback is caused that the adhesive composition eventually foams in the course of curing.

The component (C) in the adhesive composition used in the invention is a catalyst to promote the addition reaction or so-called hydrosilation reaction between the aliphatically unsaturated hydrocarbon groups in the component (A) and the silicon-bonded hydrogen atoms in the components (B1) and/or (B2). Such a catalytic compound is well known in the art of silicone products and is selected from the compounds of a noble metal belonging to the VIIIth Group of the Periodic Table or, in particular, platinum. Suitable platinum compounds include chloroplatinic acid, complexes of chloroplatinic acid with an olefin such as ethylene, complexes of chloroplatinic acid with an alcohol or a vinyl siloxane and the like in the form of a solution as dissolved in a suitable organic solvent.

The amount of the component (D) in the adhesive composition used in the invention is in such a range that from 1 to 1000 ppm by weight or, preferably, from 10 to 500 ppm by weight of the platinum metal is provided based on the total amount of the other essential components (A) and (B), i.e. (B1) and/or (B2). When the amount of the component (C) is too small, the curing velocity of the adhesive composition would be insufficiently low while no further advantages can be obtained by increasing the amount to exceed the above mentioned upper limit rather with an economical disadvantage due to the expensiveness of the platinum compound. When the adhesive composition is admixed with an appropriate amount of the component (C), the adhesive composition can be fully cured within a few minutes to several hours at a temperature of 100° to 200° C.

The adhesive composition used in the invention can be prepared by uniformly blending the above described components (A), (B), i.e. (B1) and/or (B2), and (C) each in a specified amount. It is optional that the adhesive composition is further admixed with various kinds of known additives used in silicone-based adhesive compositions each in a limited amount. For example, the adhesive bonding strength with the adhesive composition can be improved by the admixture of an organopolysiloxane resin consisting of the tetrafunctional siloxane units of the unit formula SiO$_2$ and the monofunctional siloxane units of the unit formulas of ViMe$_2$SiO$_{0.5}$ and/or Me$_3$SiO$_{0.5}$. Further, the curing velocity of the adhesive composition can be controlled by the admixture of an organopolysiloxane having units of the formula ViMe$_2$O$_{0.5}$, an acetylenic compound or an ionic compound of a heavy metal. The adhesive composition after curing can be imparted with flexibility by admixing the composition with an organopolysiloxane without functionality.

When the adhesive composition is admixed with an inorganic filler such as fumed silica, quartz powder, glass fibers, carbon powders, iron oxide, titanium dioxide, ceric oxide, calcium carbonate, magnesium carbonate and the like, the adhesive composition can be improved relative to a decrease in the shrinkage caused by curing, decrease in the thermal expansion coefficient of the cured adhesive composition and increase in the thermal stability, weatherability and mechanical strengths. Coloring agents such as pigments and dyes and antioxidants are also among the additives optionally added to the adhesive composition. If necessary, the adhesive composition can be diluted by the addition of a suitable organic solvent such as toluene and xylene to be imparted with a viscosity suitable for application.

The improvement according to the present invention can be achieved irrespective of the polymeric material from which the pellicle membrane is formed. For example, the invention is applicable to the pellicle membranes formed from cellulose derivatives such as nitrocellulose and cellulose acetate which, however, have various disadvantages including a strong absorption band of the light in the short wavelength region of 210 to 500 nm and poor stability to cause yellowing or polymeric degradation by the irradiation with short wavelength light such as the g-line, i-line and excimer laser beams so that these cellulose derivatives can hardly be used as a material of the pellicle membranes used in the photolithographic patterning of VLSIs and extremely fine liquid crystal display units which require patternwise exposure with the short wavelength light.

Accordingly, the advantages of the improvement according to the invention can be fully exhibited when the pellicle membrane is formed from a polymeric material having a sufficiently long serviceable life irrespective of the wavelength of the light under irradiation of which the frame-supported membrane is used. Suitable polymeric materials in this regard include those previously proposed by some of the inventiors such as polymers of vinyl trimethyl silane, pullulan compounds, amorphous fluorocarbon polymers, silicone-modified polyvinyl alcohols and the like, of which the amorphous fluorocarbon polymers are the most preferable. It is of course optional that the pellicle membrane of these polymers is provided on the surface with a transparent electroconductive film or a layer rendered hydrophilic in order to reduce accumulation of static electricity responsible for attraction of dust particles or with a low-reflectance film of magnesium fluoride, calcium fluoride and the like to increase light transmission through the membrane.

The pellicle membrane of these polymers can be prepared by the solution casting method in which a solution of the polymer in a concentration of 3 to 10% by weight in a suitable organic solvent is spread over the surface of a flat substrate plate such as a silicon wafer, glass plate and the like by using a spin coater or a knife coater followed by drying. The membrane should have a thickness in the range from 0.1 to 10 μm or, preferably, from 0.5 to 5 μm in consideration of the balance between the mechanical strengths and the transparency of the membrane. It is desirable that the pellicle membrane has a transmissivity of at least 95% or, preferably, at least 98% of the light of 210 to 500 nm wavelength although a transmissivity of 90% or larger would be acceptable when a relatively large thickness of 5 μm or more is desired for some reason. It is also optional that the pellicle membrane is coated with a sticky adhesive on the surface to face the photomask when the frame-supported pellicle is mounted thereon with an object to capture dust particle floating in the space between the photomask and the pellicle membrane.

In the following, the improvement according to the invention is described in more detail by way of examples and comparative examples.

EXAMPLES 1 AND 2 AND COMPARATIVE EXAMPLE.

A polymer solution in a concentration of 8.0% by weight was prepared by dissolving a copolymer consisting of a tetrafluoroethylene moiety and a cyclic perfluoroether moiety as expressed by the formula

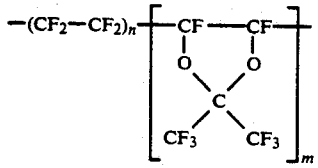

in which the ratio of m:(n+m) was 0.66, (Teflon AF 1600, a product by Du Pont Co.) in a solvent mainly consisting of perfluoro(2-butyl tetrahydrofuran) (Florinert FC 75, a product by Minnesota Mining & Manufacturing Co.).

This polymer solution was spread by using a spin coater over the surface of a polished fused quartz glass plate having a diameter of 200 mm and a thickness of 3 mm and dried by heating at 150° C. for 3 hours to give a dried transparent polymer film having a thickness of 1.21 μm, which was peeled from the substrate surface in water and transferred on to a Teflon-made annular frame having an outer diameter of 150 mm followed by drying at 100° C. for 5 hours in a vacuum drying oven.

Separately, a fluorocarbon-containing organopolysiloxane-based adhesive composition, referred to as the composition I hereinbelow, was prepared by first uniformly blending, in a kneader at 150° C. for 2 hours, 100 g of a fluorocarbon-containing siloxane polymer having a viscosity of 5700 centistokes at 25° C., of which the content of the vinyl groups was 0.008 mole/100 g, and expressed by the formula

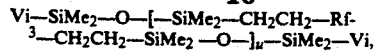

in which the subscript u is an average number of about 2.5 and $Rf^3$ is a divalent group expressed by the formula

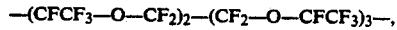

as the component (A) and 15 g of a fumed silica filler after a silylating surface treatment with hexamethyl disilazane followed by kneading on a three-roller mill and then admixing the blend uniformly with 1.8 g of an organohydrogenpolysiloxane expressed by the formula

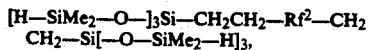

in which $Rf^2$ has the same meaning as defined before, as the component (B1), 1.8 g of another organohydrogenpolysiloxane expressed by the formula

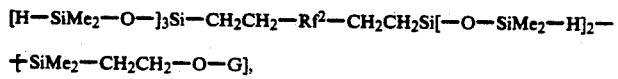

in which G is a glycidyl group and $Rf^2$ has the same meaning as defined before, as the component (B2), 0.47 g of carbon black, 0.1 g of a toluene solution of chloroplatinic acid modified with 1,3-divinyl-1,1,3,3-tetramethyl disiloxane in a concentration of 1.0% by weight as platinum metal as the component (C).

Another adhesive composition, referred to as the composition II hereinbelow, was prepared for comparative purpose in the same formulation as the composition I above excepting omission of the glycidyl-containing organohydrogenpolysiloxane as the component (B2) and increase of the amount of the organohydrogenpolysiloxane as the component (B1) to 3.6 g instead of 1.8 g.

Each of the above prepared adhesive compositions I and II was applied, in Examples 1 and 2, respectively, in a coating thickness of about 100 μm to the peripheral area of the polymeric film of Teflon AF 1600 dried on the Teflon frame and an aluminum frame having an inner diameter of 130 mm, outer diameter of 134 mm and thickness of 2 mm was put thereon and adhesively bonded to the film by heating at 120° C. for 2 hours to give a frame-supported pellicle by curing the adhesive composition. The membrane had a transmissivity of 98% for the i-line light having a wavelength of 365 nm.

For comparison in Comparative Example, another frame-supported pellicle was prepared in the same manner as above excepting the use of an epoxy-based adhesive (Araldite Rapid, a product by Showa Kobunshi Co.), in place of the compositions I and II, which could be fully cured by standing at room temperature for 24 hours.

The adhesive bonding strength between the polymeric membrane and the aluminum frame in each of the thus prepared frame-supported pellicles was tested in the following manner. Thus, the frame-supported pellicle was held horizontally with the polymeric membrane facing downwardly and water was put on the area of the membrane surrounded by the aluminum frame drop by drop and the amount of the water on the membrane was recorded when peeling took place between the frame and the membrane. The results were 125 g, 53 g and 2.8 g in Examples 1 and 2 and Comparative Example, respectively.

The stability of the adhesive bonding between the frame and membrane against irradiation with light was tested by irradiating the adhesively bonded area of the membrane for 1000 hours with an excimer laser beam having an intensity of 200 watts/cm² and subjecting the frame-supported pellicle after exposure to light to the same peeling test as above to give results of 125 g and 50 g of the weight of water in Examples 1 and 2, respectively, absolutely without any noticeable changes in the appearance while the membrane in Comparative Example was peeled almost spontaneously showing no peeling resistance and the epoxy-based adhesive had turned black and was very brittle.

EXAMPLES 3 and 4.

A polymer solution in a concentration of 50% by weight was prepared by dissolving a fluorocarbon-containing copolymeric resin consisting of a tetrafluoroethylene moiety and a cyclic perfluoroether moiety and expressed by the formula

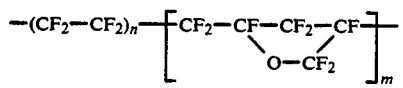

in which the ratio of m:(n+m) was 0.7, (Saitop, a product by Asahi Glass Co.) in the same fluorocarbon solvent as used in the preceding examples. Polymer films having a thickness of 1.32 μm were prepared in about the same manner as in Example 1 from this polymer solution. This polymer film had a transmissivity of 97.2% for the excimer laser beam of 248 nm wavelength.

Separately, an adhesive composition, referred to as the composition III hereinbelow, was prepared in Example 3 in the same formulation as the composition I excepting replacement of the glycidyl-containing organohydrogenpolysiloxane as the component (B2) with the same amount of another glycidyl-containing organohydrogenpolysiloxane expressed by the formula

[G—O—CH₂CH₂—SiMe₂—O—][H—SiMe₂—O—]₂Si—CH₂CH₂—Rf⁴—CH₂CH₂—

—Si[—O—SiMe₂—H]₂[—O—SiMe₂—CH₂CH₂—O—G], in which Rf⁴ is a divalent group expressed by the formula

—(CFCF₃—O—CF₂)₂—(CF₂—O—CFCF₃)₂—.

A still another adhesive composition, referred to as the composition Iv hereinbelow, was prepared in Example 4 in the same formulation as the composition I excepting replacement of the fluorocarbon-containing siloxane polymer as the component (A) with the same amount of another fluorocarbon-containing siloxane polymer having a viscosity of 8200 centistokes at 25° C., of which the content of the vinyl groups was 0.007 mole/100 g, and expressed by the formula

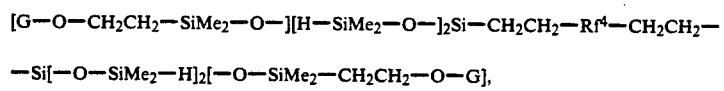

in which the subscripts x and y are each a positive integer of about 30 and about 5, respectively, and Rf³ is a divalent group expressed by the formula

—(CFCF₃—O—CF₂)₂—(CF₂—O—CFCF₃)₃—.

These adhesive compositions III and IV were each used for adhesively bonding the polymer film to an aluminum frame in the same manner as in Example 1 to give a frame-supported pellicle of which the test for the adhesive bonding strength was undertaken in the same manner as in Example 1 to give results of 133 g and 92 g of the weight of water on the membrane in Examples 3 and 4, respectively.

The stability of the adhesive bonding in these frame-supported pellicles against irradiation with light was tested in the same manner as in Example 1 to give results of the adhesive bonding strength between the membrane and the frame member corresponding to 134 g and 99 g of the weight of the water on the membrane in Examples 3 and 4, respectively, absolutely without any noticeable changes in the appearance.

What is claimed is:

1. In a frame-supported pellicle used for protection of a photolithographic photomask in the manufacture of electronic devices consisting of a frame member and a transparent membrane of a polymeric material flatly supported by the frame member by adhesively bonding the frame member and the polymeric membrane using an adhesive, the improvement which comprises:

adhesively bonding the frame member and the polymeric membrane by use of an adhesive which is a fluorocarbon group-containing organopolysiloxane-based composition and which is a uniform blend which comprises:

(A) a fluorocarbon group-containing organosiloxane polymer represented by the general formula XO$\{$SiR¹Me—CH₂CH₂—Rf¹—CH₂CH₂—SiR¹Me—O$\}_a$ $\{$SiR²Me—CH₂CH₂—(CF₂)$_d$—CH₂CH₂—SiR²Me—O$\}_b$ $\{$SiR³Me—O$\}_c$X, in which Me is a methyl group, R¹, R² and R³ are each an unsubstituted or substituted monovalent hydrocarbon group free from aliphatic unsaturation, Rf¹ is a divalent group having 1 to 30 carbon atoms selected from the class consisting of perfluoroalkylene groups and perfluoropolyether groups, X is a triorganosilyl group of which at least one of the three organic groups is an aliphatically unsaturated hydrocarbon group, the subscript a is a positive integer in the range from 1 to 300, the subscript b is zero or a positive integer not exceeding 300, the subscript c is zero or a positive integer not exceeding 5000 and the subscript d is a positive integer in the range from 2 to 8;

(B) either one or a combination of (B1) an organohydrogenpolysiloxane having at least two hydrogen atoms directly bonded to the silicon atoms in a molecule, of which the organic groups are each an alkyl group or a halogen-substituted alkyl group, the amount thereof being sufficient to provide from 0.5 to 5 moles of the silicon-bonded hydrogen atoms per mole of the aliphatically unsaturated groups in the component (A) and (B2) an organohydrogenpolysiloxane having at least two hydrogen atoms directly bonded to the silicon atoms in a molecule and containing a fluorine-substituted hydrocarbon group and an epoxy group, the amount thereof being sufficient to provide from 0.1 to 3 moles of the silicon-bonded hydrogen atoms per mole of the aliphatically unsaturated groups in the component (A); and (C) a catalytic amount of a compound of a noble metal belonging to the VIIIth Group of the Periodic Table.

2. The improvement as claimed in claim 1 in which the group denoted by $Rf^1$ is a group represented by the general formula $$-(CF_2CF_2-O-CF_2)_e-(CFCF_3-O-O-CF_2)_f-(CF_2)_g-$$
$$-(CF_2-O-CFCF_3)_h-(CF_2-O-CF_2CF_2)_i-,$$

in which the subscripts f and h are each zero or a positive integer not exceeding 5, the subscript g is zero or a positive integer not exceeding 8 and the subscripts e and i are each zero or 1.

3. The improvement as claimed in claim 1 in which the noble metal belonging to the VIIIth Group of the Periodic Table is platinum.

* * * * *